(12) United States Patent
Nakamura

(10) Patent No.: US 6,454,914 B1
(45) Date of Patent: *Sep. 24, 2002

(54) FERROELECTRIC CAPACITOR AND A METHOD FOR MANUFACTURING THEREOF

(75) Inventor: Takashi Nakamura, Kyoto (JP)

(73) Assignee: Rohm Co., Ltd., Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/812,059

(22) Filed: Feb. 20, 1997

Related U.S. Application Data

(63) Continuation of application No. PCT/JP96/01883, filed on Jul. 5, 1996.

(30) Foreign Application Priority Data

Jul. 7, 1995 (JP) ............................................. 7-172142

(51) Int. Cl.[7] .......................... C23C 14/34; H01L 21/20
(52) U.S. Cl. ............................ 204/192.17; 204/192.15; 204/192.22; 438/381; 438/393
(58) Field of Search ....................... 204/192.15, 192.17, 204/192.18, 192.22; 438/381, 393

(56) References Cited

U.S. PATENT DOCUMENTS

| | | | | |
|---|---|---|---|---|
| 3,616,400 A | * | 10/1971 | Wasa et al. | 204/192 |
| 3,819,990 A | * | 6/1974 | Hayashi et al. | 317/258 |
| 3,969,197 A | * | 7/1976 | Tolar et al. | 204/15 |
| 4,038,167 A | * | 7/1977 | Young | 204/192 |
| 4,058,445 A | * | 11/1977 | Anders | 204/192 SP |
| 5,142,437 A | | 8/1992 | Kammerdiner et al. | 361/313 |
| 5,164,808 A | | 11/1992 | Evans, Jr. et al. | 361/305 |
| 5,561,307 A | * | 10/1996 | Mihara et al. | 257/295 |
| 5,665,210 A | * | 9/1997 | Yamazaki | 438/3 |
| 5,995,359 A | | 11/1999 | Klee et al. | 361/305 |

FOREIGN PATENT DOCUMENTS

| | | | |
|---|---|---|---|
| EP | 0415750 A1 | 8/1990 | ........... H01L/29/92 |
| EP | 0 409 018 | 1/1991 | ........... H01G/4/008 |
| EP | 0 415 750 | 3/1991 | ........... H01L/29/92 |
| EP | 0 514 149 | 11/1992 | ............. H01G/7/06 |
| EP | 0 609 081 | 8/1994 | ....... H01L/21/3205 |
| JP | 7-169854 | 4/1995 | ....... H01L/21/8242 |

OTHER PUBLICATIONS

International Search Report for PCT/JP96/01883.

Nakamura et al., *Integrated Ferroelectric*, 11:161–170, 1995.

Vijay, D. P. et al., "Electrodes for PBZRXTI1–X03 Ferroelectric Thin Films", Journal of the Electrochemical Society, vol. 140, No. 9, pp. 2640–2645 Sep. 1993.

Lee Jeong–gun et al., "Deposition and Properties of Reactively Sputtered Ruthenium Dioxidethin Films as an Electrode for Ferroelectric Capacitors", Japanese Journal of Applied Physics, vol. 33, No. 12B, Part 01, pp. 7080–7085 Dec. 1994.

* cited by examiner

*Primary Examiner*—Steven H. Ver Steeg
(74) *Attorney, Agent, or Firm*—Darby & Darby

(57) ABSTRACT

An object of the present invention is to provide a ferroelectric capacitor which shows excellent ferroelectricity. A silicon oxidation layer 4, a lower electrode 12, a ferroelectric layer 8 and an upper electrode 15 are formed on a silicon substrate 2. The lower electrode 12 is made of palladium oxide. Also, the upper electrode 15 is made by palladium oxide, since palladium oxide prevents leakage of oxygen contained in the ferroelectric layer 8. Thus, the ferroelectric capacitor of the present invention offers excellent ferroelectricity can be realized.

26 Claims, 9 Drawing Sheets

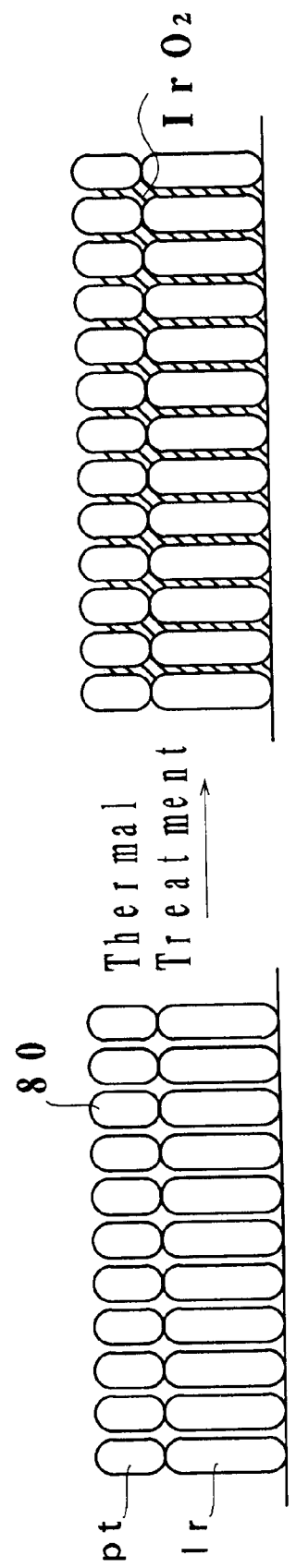

FERROELECTRIC CAPACITOR AND A METHOD FOR MANUFACTURING THEREOF

This is a continuation of international application Ser. No. PCT/JP96/01883, filed Jul. 5, 1996, the disclosure of which is hereby incorporated by reference.

FIELD OF THE INVENTION

The present invention relates to a ferroelectric capacitor, more specifically, improvement of ferroelectricity and other characteristics of the capacitor.

BACKGROUND ART

FIG. 10 shows a conventional ferroelectric capacitor. A silicon oxidation layer 4 is formed on a silicon substrate 2. A lower electrode 6 made of platinum is provided thereon. A PZT ($PbZr_x Ti_{1-x}O_3$) film 8 as a ferroelectric layer is formed on the lower electrode 6, and an upper electrode 10 made of platinum is provided thereon. Thus, the ferroelectric capacitor is formed by the lower electrode 6, the PZT film 8 and the upper electrode 10.

The reason to use platinum for the lower electrode 6 is as follows. The PZT film 8 must be formed on a layer which can be oriented. The ferroelectricity of PZT is degraded if the PZT film can not be oriented, for example, when the PZT film is formed on an amorphous layer. Meanwhile, the lower electrode 6 must be formed under insulation from the silicon substrate 2. As such, the silicon oxidation layer 4 is formed on the silicon substrate 2. The silicon oxidation layer 4 is made of amorphous material. In general, although a layer formed on an amorphous material becomes nonorientable, a layer made of platinum has a characteristic of becoming orientable even when it is formed on the amorphous material. Therefore, platinum is used for forming the lower electrode because of the reason described in the above.

However, the conventional ferroelectric capacitor has following problem to be resolved.

The problems is degradation of ferroelectricity caused by frequent inversion of polarization, aging and leakage of oxygen from the ferroelectric substance (PZT), since platinum has a tendency of allowing oxygen and Pb to pass through it. In other words, there is high probability of leakage of oxygen and Pb contained in the ferroelectric substance through the columnar crystals of platinum shown in FIG. 11. The problem also arises in a capacitor using dielectric substance having high dielectric constant.

DISCLOSURE OF THE PRESENT INVENTION

It is an object of the present invention to provide a ferroelectric capacitor having less degradation of ferroelectricity caused by frequent inversion of polarization and aging or by a dielectric capacitor maintaining high dielectric constant, both of which resolve the problem described in the above.

The word "capacitor" in the present invention defines structure providing for electrodes on both sides of an insulator, also it is a concept having the structure stated in the above regardless of using the structure for electric storage.

In accordance with characteristic of the present invention, a ferroelectric capacitor comprises:

a lower electrode having an oxidation layer made of any one of following layers, the layers at least including a layer made of WOx, a layer made of TiOx, a layer made of TaOx, a layer made of $IrO_2$, a layer made of $PtO_2$, a layer made of RuOx, a layer made of ReOx, a layer made of PdOx and a layer made of OsOx, a dielectric layer composed by either of ferroelectric substance or dielectric substance having a high dielectric constant, the dielectric layer being formed on the lower electrode, and an upper electrode formed on the dielectric layer.

In other words, the lower electrode has at least one of following oxidation layers such as the Wox layer, the TiOx layer, the TaOx layer, the $IrO_2$ layer, the $PtO_2$ layer, the RuOx layer, the ReOx layer, the PdOx layer and the OsOx layer. Therefore, it is possible to prevent leakage of oxygen from the dielectric layer as well as suppressing degradation of ferroelectricity caused by aging.

Also, in accordance with characteristic of the present invention, the lower electrode is composed by forming a conductive layer made of any one of following layers, the layers at least including a layer made of W, a layer made of Ti, a layer made of Ta, a layer made of Ir, a layer made of Pt, a layer made of Ru, a layer made of Re, a layer made of Pd and a layer made of Os on the oxidation layer, and a ferroelectric layer is formed on the conductive layer.

Further, in accordance with characteristic of the present invention, the lower electrode is formed on a silicon oxidation layer located on a substrate, and wherein the lower electrode has a contact layer contacted to the silicon oxidation layer.

That is, one of the following conductive layer such as the W layer, the Ti layer, the Ta layer, the Ir layer, the Pt layer, the Ru layer, the Re layer, the Pd layer and the layer Os layer is provided on the oxidation layer. Then the dielectric layer is formed on the conductive layer. Therefore, leakage current can be decreased.

Still further, in accordance with characteristic of the present invention, a ferroelectric capacitor comprises:

a lower electrode, a dielectric layer composed by either of ferroelectric substance or dielectric substance having a high dielectric constant, the dielectric layer being formed on the lower electrode, and an upper electrode formed on the dielectric layer and having an oxidation layer made of any one of following layers, the layers at least including a layer made of WOx, a layer made of TiOx, a layer made of TaOx, a layer made of $IrO_2$, a layer made of $PtO_2$, a layer made of RuOx, a layer made of ReOx, a layer made of PdOx and a layer made of OsOx.

In other words, the upper electrode has at least one of following conductive layers such as the WOx layer, the TiOx layer, the TaOx layer, the $IrO_2$ layer, the $PtO_2$ layer, the RuOx layer, the ReOx layer, the PdOx layer and the OsOx layer. Therefore, it is possible to prevent leakage of oxygen from the dielectric layer as well as suppressing degradation of ferroelectricity caused by aging.

In accordance with characteristic of the present invention, the lower electrode is formed on a silicon oxidation layer located on a substrate, and wherein the lower electrode has a contact layer contacted to the silicon oxidation layer.

Also, in accordance with characteristic of the present invention, a ferroelectric capacitor comprises:

a lower electrode having an oxidation layer made of any one of following layers, the layers at least including a layer made of WOx, a layer made of TiOx, a layer made of TaOx, a layer made of $IrO_2$, a layer made of $PtO_2$, a layer made of RuOx, a layer made of ReOx, a layer made of PdOx and a layer made of OsOx, a dielectric layer composed by either of ferroelectric substance or dielectric substance having a high dielectric constant, the dielectric layer being formed on the lower electrode, and an upper electrode having an oxidation layer made of any one of following layers, the layers at least including a layer made of WOx, a layer made of TiOx, a layer made of TaOx, a layer made of $IrO_2$, a layer made of $PtO_2$, a layer made of RuOx, a layer made of ReOx, a layer made of PdOx and a layer made of OsOx.

That is, both of the upper electrode and the lower electrode have at least one of following oxidation layers such as the WOx layer, the TiOx layer, the TaOx layer, the $IrO_2$ layer, the $PtO_2$ layer, the layer RuOx layer, the ReOx layer, the PdOx layer and the OsOx layer. Therefore, it is possible to prevent leakage of oxygen from the dielectric layer as well as suppressing degradation of ferroelectricity caused by aging.

Further, in accordance with characteristic of the present invention, the lower electrode is composed by forming a conductive layer made of any one of following layers, the layers at least includes a layer made of W, a layer made of Ti, a layer made of Ta, a layer made of Ir, a layer made of Pt, a layer made of Ru, a layer made of Re, a layer made of Pd and a layer made of Os on the oxidation layer, and wherein a ferroelectric layer is formed on the conductive layer.

Still further, in accordance with characteristic of the present invention, the lower electrode is formed on a silicon oxidation layer located on a substrate, and wherein the lower electrode has a contact layer contacted to the silicon oxidation layer.

In other words, one of the following conductive layer such as the W layer, the Ti layer, the Ta layer, the Ir layer, the Pt layer, the Ru layer, the Re layer, the Pd layer and the Os layer is provided on the oxidation layer. Then the dielectric layer is formed on the conductive layer. Therefore, leakage current can be decreased.

In accordance with the present invention, a ferroelectric capacitor which offers excellent ferroelectricity and high-dielectric property can be provided.

In accordance with characteristic of the present invention, a method for manufacturing a ferroelectric capacitor comprises steps of:

forming any one of the following oxidation layers including a layer made of WOx, a layer made of TiOx, a layer made of TaOx, a layer made of $IrO_2$, a layer made of $PtO_2$, a layer made of RuOx, a layer made of ReOx, a layer made of PdOx and a layer made of OsOx on a substrate as a lower electrode by a sputtering method, forming either of a ferroelectric film or a dielectric layer having a high dielectric constant on the lower electrode as a dielectric layer, and forming an upper electrode on the dielectric layer.

Also, in accordance with characteristic of the present invention, a method for manufacturing a ferroelectric capacitor comprises steps of:

forming any one of the following layers including a layer made of a layer made of W, a layer made of Ti, a layer made of Ta, a layer made of Ir, a layer made of Pt, a layer made of Ru, a layer made of Re, a layer made of Pd and a layer made of Os on a substrate as a base layer by a sputtering method, oxidizing a surface of the base layer, forming either a ferroelectric film or a dielectric layer having a high dielectric constant on the base layer as a dielectric layer, a surface of the base layer being oxidized, and forming an upper electrode on the dielectric layer.

Further, in accordance with characteristic of the present invention, a method for manufacturing a ferroelectric capacitor comprises steps of:

forming either a ferroelectric film or a dielectric layer having a high dielectric constant on a lower electrode as a dielectric layer, and forming any one of the following oxidation layers including a layer made of WOx, a layer made of TiOx, a layer made of TaOx, a layer made of $IrO_2$, a layer made of $PtO_2$, a layer made of RuOx, a layer made of ReOx, a layer made of PdOx and a layer made of OsOx on the dielectric layer as an upper electrode by a sputtering method.

Still further, in accordance with characteristic of the present invention a method for manufacturing a ferroelectric capacitor comprises steps of:

forming a lower electrode on a substrate, forming either a ferroelectric film or a dielectric layer having a high dielectric constant on the lower electrode as a dielectric layer, forming any one of the following layers including a layer made of a layer made of W, a layer made of Ti, a layer made of Ta, a layer made of Ir, a layer made of Pt, a layer made of Ru, a layer made of Re, a layer made of Pd and a layer made of Os on the dielectric layer as a base layer by a sputtering method, and oxidizing a surface of the base layer.

In accordance with characteristic of the present invention, a method for manufacturing a ferroelectric capacitor comprises steps of:

forming any one of the following layers including a layer made of a layer made of W, a layer made of Ti, a layer made of Ta, a layer made of Ir, a layer made of Pt, a layer made of Ru, a layer made of Re, a layer made of Pd and a layer made of Os on a substrate as a base layer by a sputtering method, forming any one of the following layers including a layer made of a layer made of W, a layer made of Ti, a layer made of Ta, a layer made of Ir, a layer made of Pt, a layer made of Ru, a layer made of Re, a layer made of Pd and a layer made of Os on a surface of the base layer as a conductive layer, oxidizing the conductive layer, a thin conductive layer being formed on a surface of the conductive layer, step for forming either of a ferroelectric film or a dielectric layer having a high dielectric constant on the conductive layer as a dielectric layer, the conductive layer being oxidized, and forming an upper electrode on the dielectric layer.

Also, in accordance with characteristic of the present invention the step of oxidization is carried out within the step for forming the dielectric layer.

While the novel features of the invention are set forth in a general fashion, both as to organization and content, it will be better understood and appreciated, along with other objections and features thereof, from the following detailed description taken in conjunction with the drawings.

BRIEF DESCRIPTION OF THE DRAWINGS

FIGS. 9A and 9B are views which show another embodiment of the present invention that caries out oxidization of palladium after forming a thin platinum layer.

THE BEST MODE OF PREFERRED EMBODIMENT TO CARRY OUT THE PRESENT INVENTION

Figure 1:
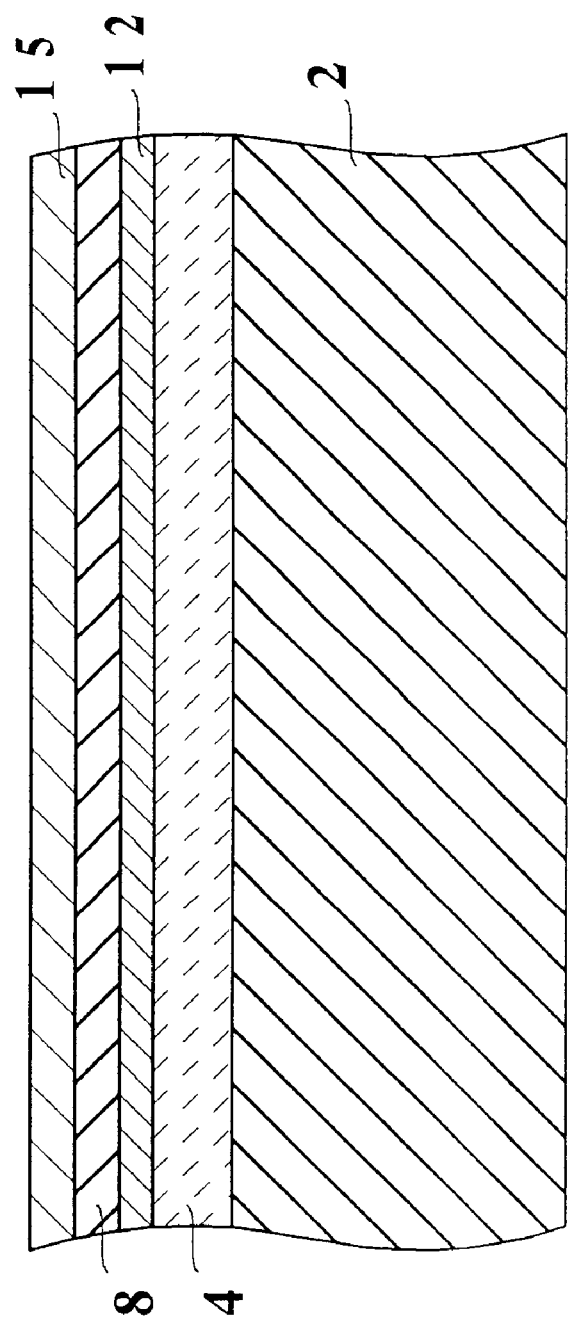
FIG. 1 is a view showing structure of a ferroelectric capacitor in an embodiment of the present invention.

FIG. 1 shows the structure of a ferroelectric capacitor fabricated by an embodiment of the present invention. In the ferroelectric capacitor, a silicon oxidation layer 4, a lower electrode 12, a ferroelectric film (ferroelectric layer) 8 and an upper electrode 15 are formed on a silicon substrate 2. The lower electrode 12 is made of palladium oxide (PdOx), and the upper electrode 15 is also formed of palladium oxide (PdOx).

Figure 11:
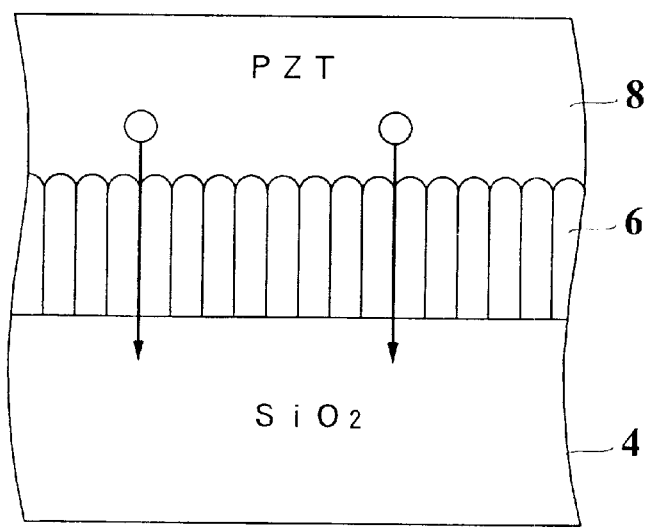
FIG. 11 is a view showing leakage of oxygen through the lower electrode 6 made of platinum.

As shown in FIG. 11 which illustrates the conventional ferroelectric capacitor, oxygen contained in the ferroelectric film 8 passes through the platinum layer having columnar crystals. Palladium oxide is used for the lower electrode 12 in this embodiment of the present invention. Since the palladium oxide layer 12 does not have columnar crystals, it is hard for the oxygen to pass through it. As such, shortage of oxygen in the ferroelectric film 8 can be prevented. Shortage of oxygen can also be prevented by the upper electrode 15 which does not have columnar crystals. Thus, ferroelectricity of the ferroelectric film 8 is improved. Remarkable improvement of ferroelectricity degradation caused by use of remnant polarization Pr is observed when either of the upper electrode 15 or the lower electrode 12 is made of palladium oxide in comparison with when either one of the electrodes is composed by platinum.

Since both of the lower electrode 12 and the upper electrode 15 are made of palladium oxide in the embodiment described in the above, the electrodes made of palladium oxide ensures prevention of leakage of oxygen and Pb. Certain prevention of leakage can be expected when either of the electrodes is made by palladium oxide.

Figure 2:
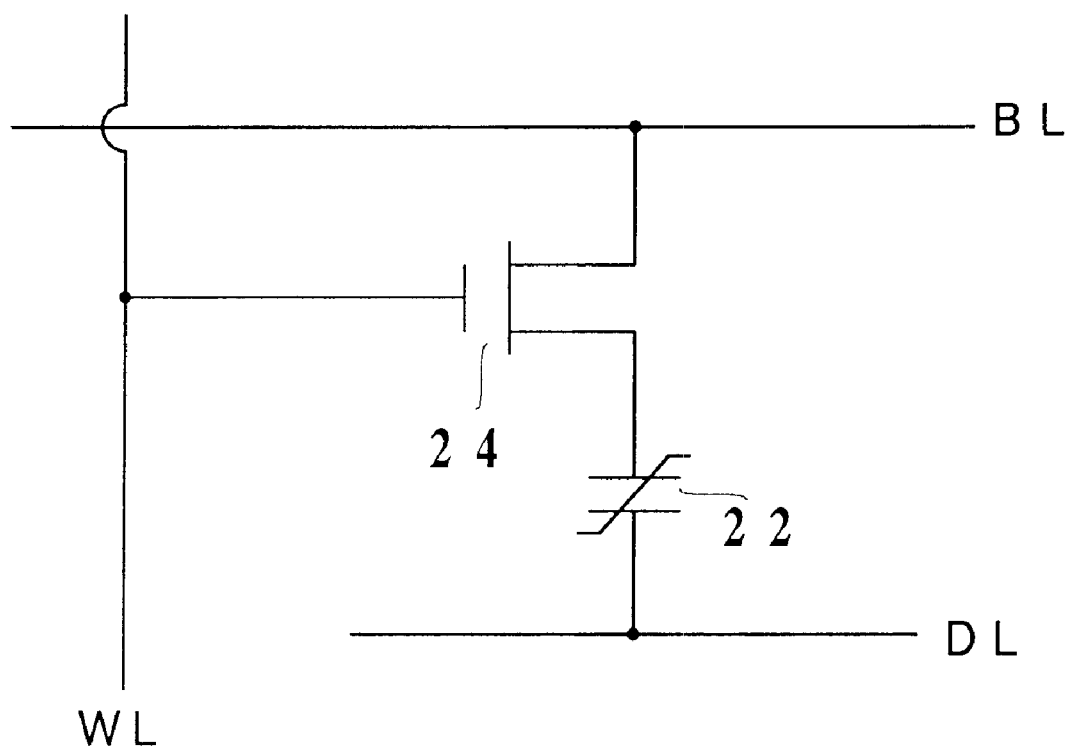
FIG. 2 is a diagram showing a nonvolatile memory using a ferroelectric capacitor 22.

The ferroelectric capacitor described in the above can be used for a nonvolatile memory when it is combined with a transistor 24 as shown in FIG. 2.

Figure 3A:
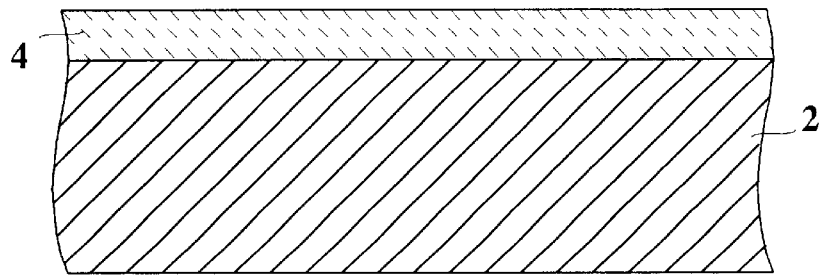
FIG. 3A, FIG. 3B, FIG. 3C and FIG. 3D are flow charts showing manufacturing processes of the ferroelectric capacitor.
Figure 3B:
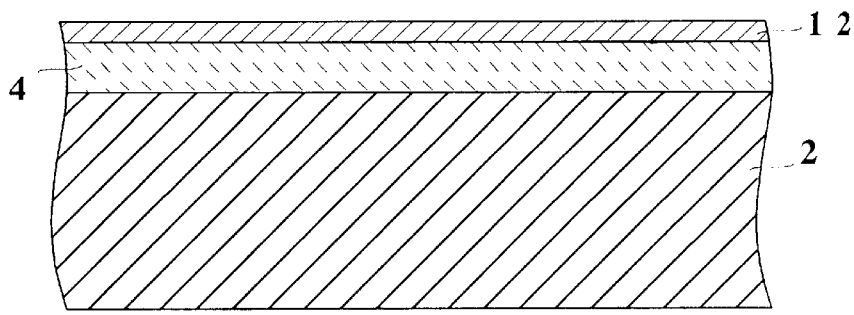

FIG. 3A, FIG. 3B, FIG. 3C and FIG. 3D are flow charts showing manufacturing processes of a ferroelectric capacitor in an embodiment of the present invention. A silicon oxidation layer 4 is formed by carrying out thermal oxidation of a surface of the silicon substrate 2 (FIG. 3A). In this embodiment, the silicon oxidation layer 4 is formed in a thickness of 600 nm. A palladium oxide formed on the silicon oxide layer 4 by a reactive sputtering method using palladium as a target is defined as the lower electrode 12 (FIG. 3B). The lower electrode 12 is formed in a thickness of 200 nm.

Figure 3C:
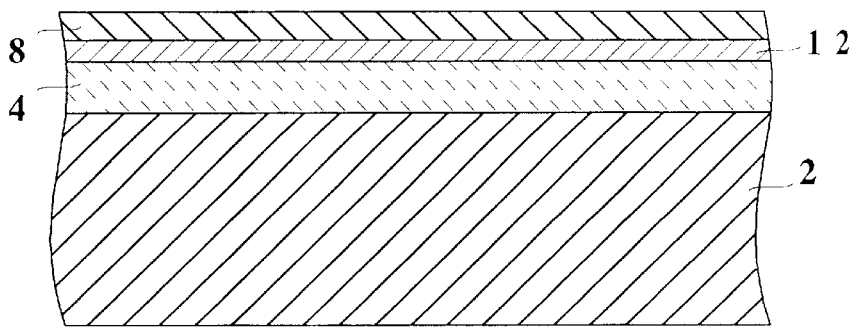

A PZT film is formed on the lower electrode 12 as the ferroelectric film 8 by sol-gel method (FIG. 3C). A mixed solution of $Pb(CH_3COO)_2 \cdot 3H_2O$, $Zr(t\text{-}OC_4H_9)_4$ and $Ti(i\text{-}OC_3H_7)_4$ is used as a starter. The mixed solution is dried at a temperature of 150° C. (hereinafter indicated in celsius) after carrying out spin coating, then pre-baking is carried out at a temperature of 400° C. for 30 seconds under dried air atmosphere. Thermal treatment at a temperature over 700° C. is carried out under $O_2$ atmosphere after carrying out the processes described in the above for 5 times. Thus, the ferroelectric film 8 having a thickness of 250 nm is formed. In this embodiment, the PZT film is formed at a ratio of x equals to 0.52 in $PbZr_xTi_{1-x}O_3$ (hereinafter the material is indicated as PZT (52·48)).

Figure 3D:
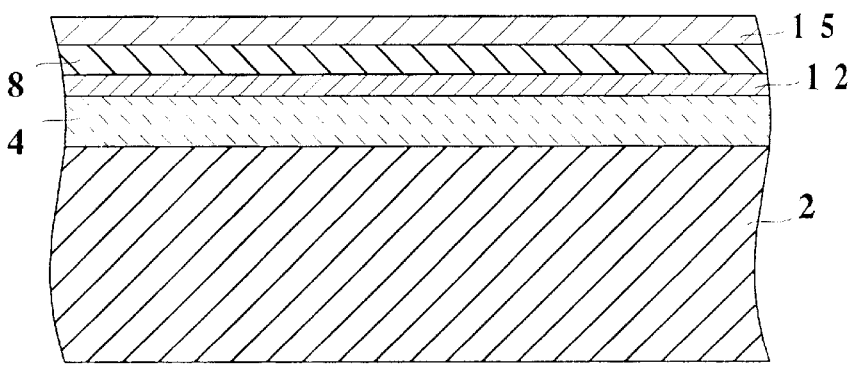

Further, a layer made of palladium oxide is formed on the ferroelectric film as the upper electrode 15 by a reactive sputtering method (FIG. 3D). The upper electrode 15 is formed in a thickness of 200 nm. Thus, the ferroelectric capacitor is completed. Any one of WOx, TiOx, TaOx, $IrO_2$, $PtO_2$, ReOx, RuOx, OsOx can be used for the palladium oxide.

In case of forming a layer made of ferroelectric substance on one of the oxidation layers, orientation of the ferroelectric substance is degraded. In order to maintain the orientation, the layer made of ferroelectric substance can be formed on any of following conductive layers: a layer made of W, a Ti layer, a layer made of Ta, an Ir layer, a layer made of Pt, a Ru layer, a layer made of Re and an Os layer or the like.

Further, leakage of the ferroelectric substance can be decreased by providing the conductive layer.

Figure 4:
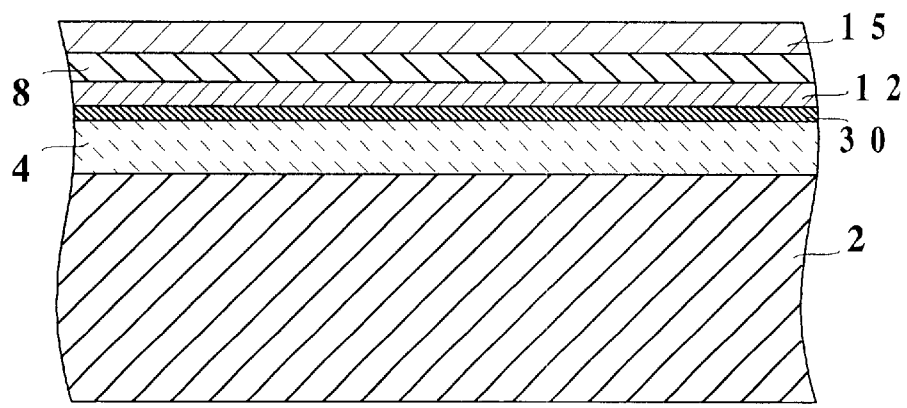
FIG. 4 is a view showing structure of the ferroelectric capacitor when a contact layer 30 is provided.

FIG. 4 shows structure of a ferroelectric capacitor fabricated by another embodiment of the present invention. In this embodiment, a layer made of titanium (having a thickness of 5 nm) is provided between the lower electrode 12 and the silicon oxidation layer 4 as a contact layer 30. In general, palladium oxide and silicon oxide do not contact tightly with each other. Thus, there is a probability of degradation of ferroelectricity caused by the partial delamination of a layer consisting of an alloy of palladium oxide and silicon oxide. To resolve the degradation, the titanium layer 30 which can be contacted with the silicon oxide layer 4 tightly is provided in this embodiment, so that the ferroelectricity is improved. The titanium layer can be formed by a sputtering method.

Although the titanium layer is used as the contact layer 30 in the embodiment described in the above, any other materials which improve contact can be utilized. For instance, a layer made of platinum can be used for the contact layer.

Though, the PZT film is used as the ferroelectric film 8 in the embodiment described in the above, any other materials can be utilized as long as the materials are ferroelectric oxide.

Figure 5:
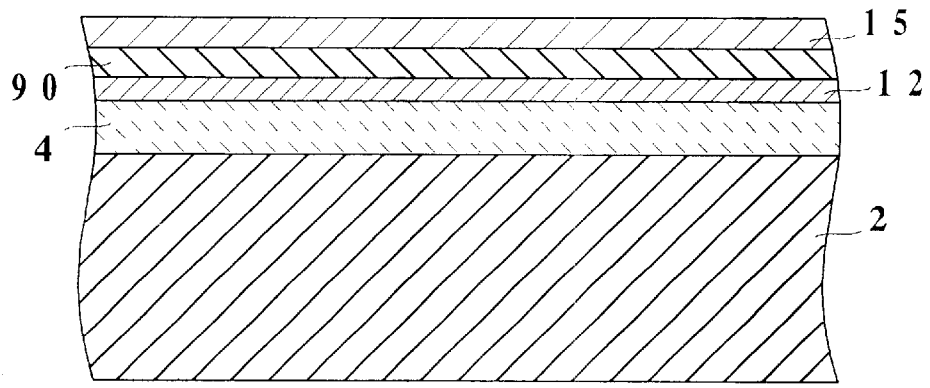
FIG. 5 is a view showing structure of the ferroelectric capacitor when a dielectric layer 90 having high dielectric constant is provided.

FIG. 5 shows the structure of a ferroelectric capacitor fabricated by another embodiment of the present invention. A dielectric layer 90 having high dielectric constant is used for the ferroelectric film 8 in this embodiment. The lower electrode 12 made of palladium oxide is provided on the silicon oxide layer 4, and a high dielectric thin film made of SrTiO$_3$, (Sr, Ba)TiO$_3$ having a perovskite structure is formed thereon as the dielectric layer 90. In this embodiment, ferroelectricity is improved in the same manner as in the embodiment using the ferroelectric substance. In other words, it is clarified that the advantages offered by using the ferroelectric layer can also be obtained by utilizing the dielectric layer having high dielectric constant.

Figure 6:
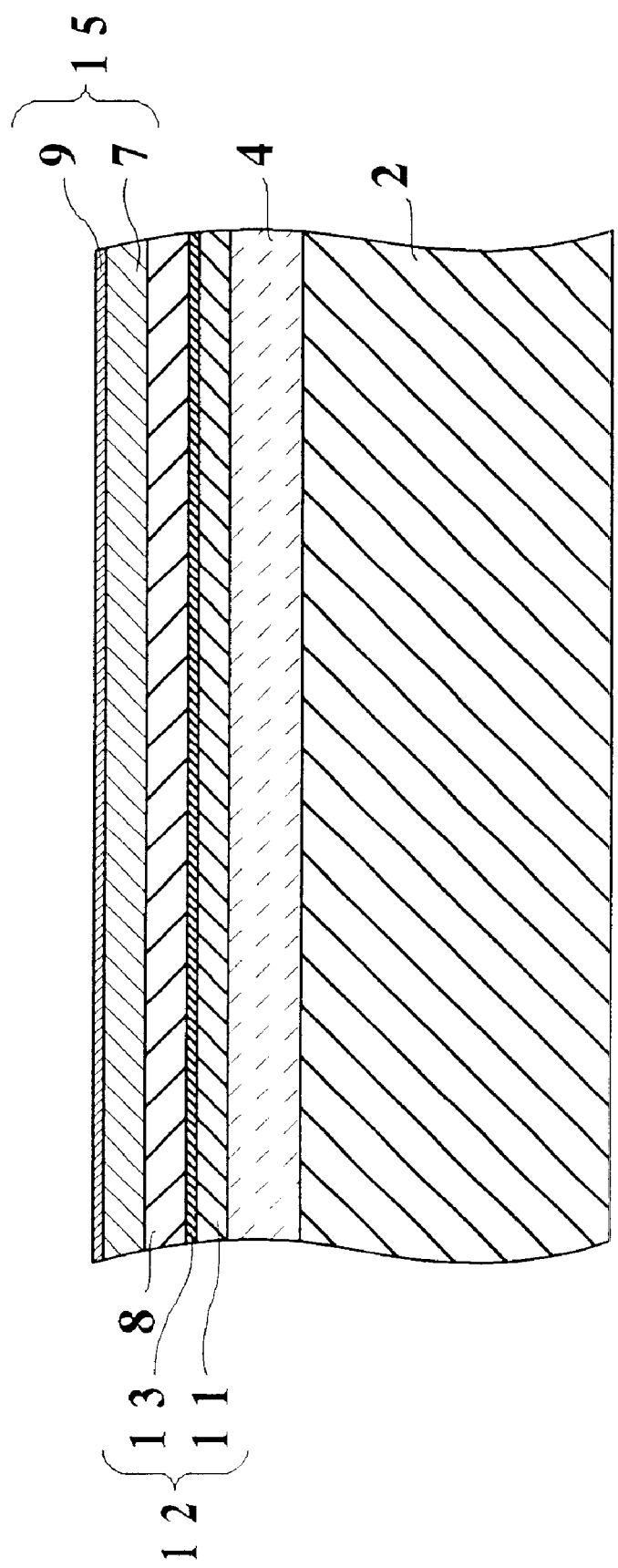
FIG. 6 is a view showing structure of a ferroelectric capacitor in another embodiment of the present invention.

FIG. 6 shows the structure of a ferroelectric capacitor fabricated by still another embodiment of the present invention. In this embodiment, the silicon oxidation layer 4, the lower electrode 12, the ferroelectric film (ferroelectric layer) 8 and the upper electrode 15 are provided on the silicon substrate 2. The lower electrode 12 consists of a palladium layer and a palladium oxide layer formed thereon. Also, the upper electrode 15 consists of a palladium layer 7 and a palladium oxide layer 9 formed thereon.

Figure 7:
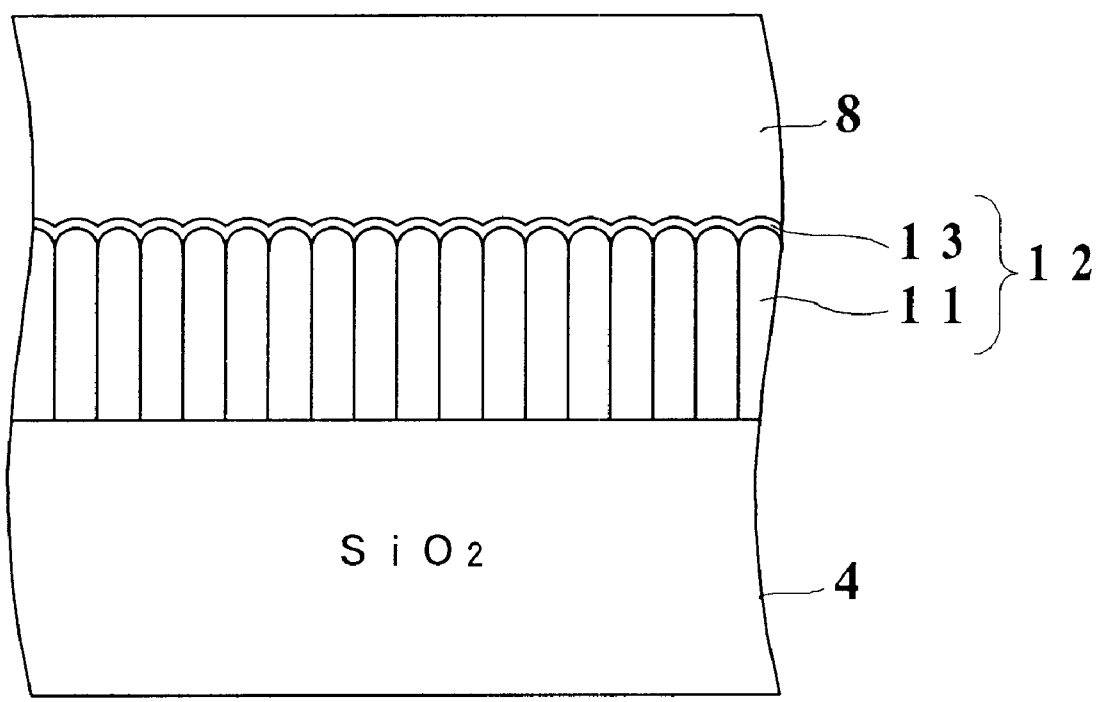
FIG. 7 is a view describing a mechanism that illustrates how the palladium oxidation layer prevents leakage of oxygen from the ferroelectric film.

FIG. 7 is an enlarged view of the vicinity of the lower electrode 12. Since the palladium oxide layer 11 has columnar crystals, the oxygen contained in the ferroelectric film 8 passes through the palladium oxide layer 11. Another palladium oxide layer 13 is formed on the upper surface of the palladium oxide layer 11 in this embodiment. As such, it is possible to prevent a shortage of oxygen contained in the ferroelectric film 8 by forming the palladium oxide layer 13 as described in the above. The upper electrode 15 obtains the same advantage which the lower electrode 12 offers as described in the above.

Since both of the palladium oxide layers are formed in the lower electrode 12 and the upper electrode 15 respectively in this embodiment, it is possible to obtain a ferroelectric capacitor having an excellent ferroelectricity as well as having less influences of aging. Certain advantage described in the above can be observed when either of the lower electrode 12 or the upper electrode 15 is formed by the structure described in the above.

Figure 8A:
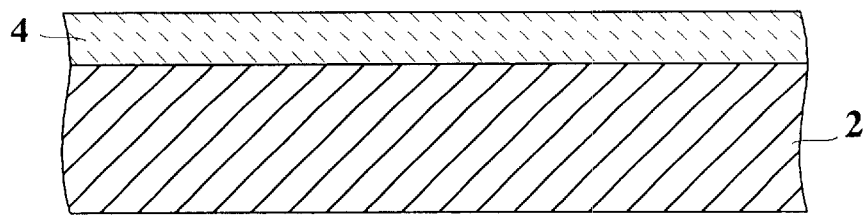
FIG. 8A, FIG. 8B, FIG. 8C and FIG. 8D are flow charts showing manufacturing processes of the ferroelectric capacitor shown in FIG. 1.
Figure 8B:
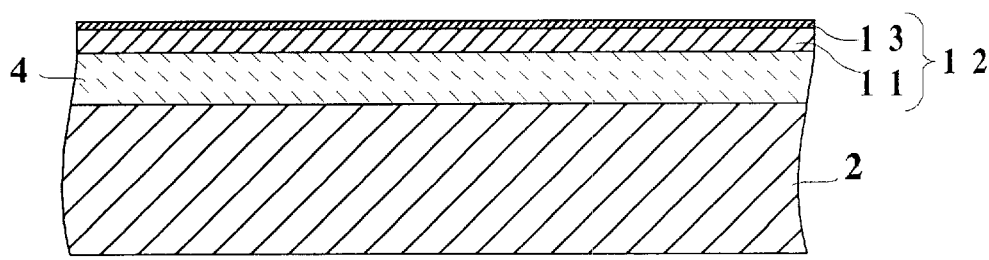

FIG. 8A, FIG. 8B, FIG. 8C and FIG. 8D are flow charts showing manufacturing processes of the ferroelectric capacitor described in the above. The silicon oxidation layer 4 is formed by carrying out thermal oxidation on a surface of the silicon substrate 2 (FIG. 8A). In this embodiment, the silicon oxidation layer 4 is formed in a thickness of 600 nm. The palladium oxide layer 11 is formed on the silicon oxide layer 4 by utilizing palladium as a target (FIG. 8B). The palladium oxide layer 13 is formed by carrying out a thermal treatment at a temperature of 800° C. for one minute under O$_2$ atmosphere. The palladium layer 11 and the palladium layer 13 thus formed are defined as the lower electrode 12. The lower electrode 12 is formed in a thickness of 200 nm.

Figure 8C:
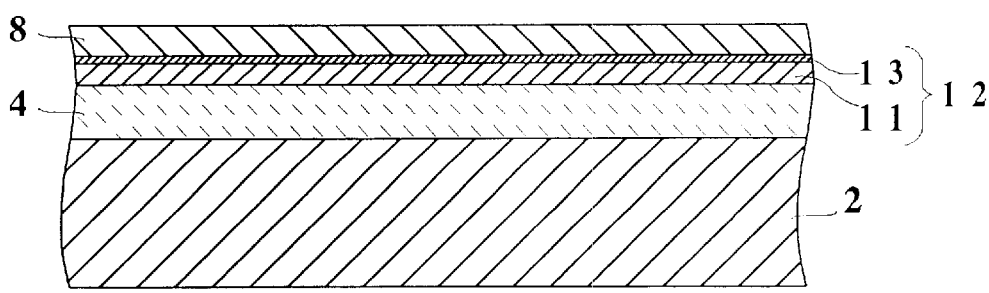

A PZT film is formed on the lower electrode 12 as the ferroelectric film 8 by sol-gel method (FIG. 8C). A mixed solution of Pb(CH$_3$COO)$_2$·3H$_2$O, Zr(t-OC$_4$H$_9$)$_4$ and Ti(i-OC$_3$H$_7$)$_4$ is used as a starter. The mixed solution is dried at a temperature of 150° C. (hereinafter indicated in celsius) after carrying out spin coating, then pre-baking is carried out at a temperature of 400° C. for 30 seconds under dried air atmosphere. Thermal treatment at a temperature over 700° C. is carried out under O$_2$ atmosphere after carrying out the processes described in the above for 5 times. Thus, the ferroelectric film 8 having a thickness of 250 nm is formed. In this embodiment, the PZT film is formed at a ratio of x equals to 0.52 in PbZr$_x$Ti$_{1-x}$O$_3$ (hereinafter the material is indicated as PZT (52·48)).

Figure 8D:
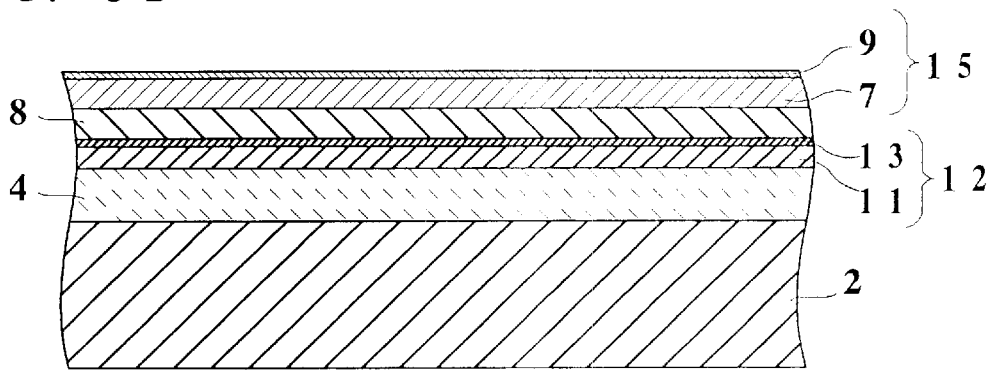
Figure 10:
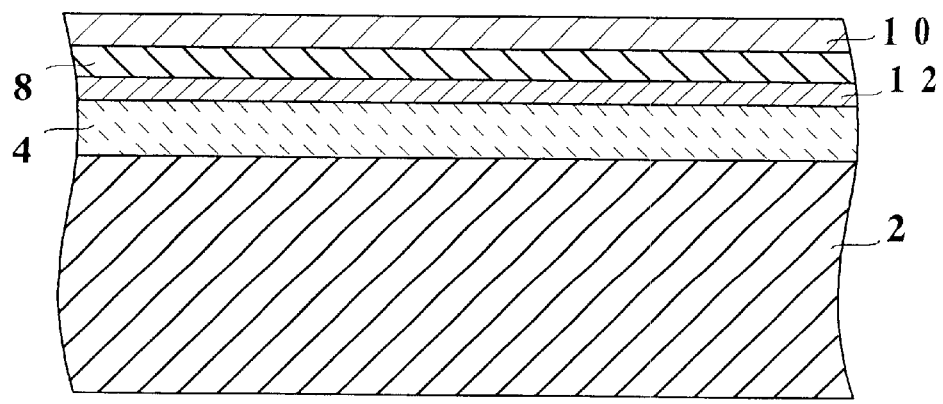
FIG. 10 is a view showing structure of the ferroelectric capacitor in the prior art.

Further, the palladium oxide 7 is formed on the ferroelectric film 8 by a sputtering method. Then, the palladium oxide layer 9 is formed on a surface of the palladium layer 7 by carrying out a thermal treatment at a temperature of 800° C. for one minute under O$_2$ atmosphere (FIG. 8D). The palladium layer 7 and the palladium oxide layer 9 thus formed are defined as the upper electrode 15. The upper electrode 15 is formed in a thickness of 200 nm. Thus, the ferroelectric capacitor is completed.

It is also preferable to form the contact layer 30 in the ferroelectric capacitor as described in FIG. 4.

The process which oxidizes a surface of the palladium described in the above can be applied not only to the ferroelectric film, but also to the dielectric layer having high dielectric constant described in the above, so that the same advantages can be expected.

As described in the above, though leakage of oxygen can be prevented by oxidizing the surface of the palladium layer, orientation of the ferroelectric layer is degraded by formation of the palladium oxide on its surface. This problem can be resolved by formation of any of following conductive layers on the palladium oxide layer 13, such as the layer made of W, the Ti layer, the layer made of Ta, the Ir layer, the layer made of Pt, the layer made of Ru, the layer made of Re and the Os layer or the like as already has been mentioned. The problem can also be resolved by forming the lower electrode as is now described.

At first, a platinum layer 80 (thin film conductive substance) is formed very thinly on the palladium layer 11 having an Ir layer as shown in FIGS. 9A and 9B. The platinum layer 80 is formed in a thickness of 30 nm as shown in FIG. 9A. Thereafter, a thermal treatment is carried out, as shown in FIG. 9B. The platinum layer is not oxidized because the platinum layer 80 exposed on the surface does not react to oxygen. Also, leakage of oxygen is shut out by the formation of palladium oxide and/or indium oxide (IrO$_2$) between the crystals of the palladium layer 11 located under the platinum layer 80 as a result of the oxidization of the crystals, because the platinum layer 80 is formed thinly. As such, the lower electrode 12 which can shut out leakage of oxygen while maintaining good orientation can be formed.

The palladium layer 11 formed on the thin platinum layer 80 and then oxidized can also be used as the lower electrode 12 by itself. The palladium layer 11 can be used as the conductive layer having good orientation in the embodiment of improving orientation by providing a conductive layer (a palladium layer, a platinum layer and the like) having good orientation on the palladium layer formed by sputtering.

Also, all of the embodiments described in the above can be applied not only to the ferroelectric capacitor using the ferroelectric film but also to the capacitor using the dielectric layer having high dielectric constant. Exactly the same advantage offered by applying the present invention to the ferroelectric film can be obtained when the present invention is applied to the dielectric layer having high dielectric constant.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method for manufacturing a ferroelectric capacitor comprising the steps of:

forming a layer of columnar crystals comprising a metal selected from the group consisting of W, Ti, Ta, Ir, Pt, Ru, Re, Pd, and Os on a substrate as a base layer by a sputtering method, oxidizing the crystals at the surface of the base layer to form a metal oxide between the columnar crystals of the layer to substantially prevent a penetration of oxygen through the layer, forming a conductive layer on the oxidized surface of the base layer, forming at least one of a ferroelectric film and a dielectric layer having a perovskite structure on the conductive layer as an insulative layer, and forming an upper electrode on the insulative layer, wherein the conductive layer substantially prevents degradation of the orientation of the insulative layer.

2. A method for manufacturing a ferroelectric capacitor comprising the steps of:

oxidizing columnar crystals at a surface of a lower electrode to form a metal oxide between the columnar crystals of the lower electrode to substantially prevent penetration of oxygen through the lower electrode;

forming a conductive layer on the oxidized surface of the lower electrode;

forming at least one of a ferroelectric film and a dielectric layer having a perovskite structure on the conductive layer as an insulative layer, and forming a layer selected from the group consisting of $WO_x$, $TiO_x$, $TaO_x$, $IrO_x$, $PtO_x$, $RuO_x$, $ReO_x$, $PdO_x$, and $OsO_x$ on the insulative layer as an upper electrode by a sputtering method, wherein the conductive layer substantially prevents degradation of the orientation of the insulative layer.

3. A method for manufacturing a ferroelectric capacitor comprising the steps of:

forming a lower electrode made of a material of columnar crystals on a substrate, forming a conductive layer on the surface of the lower electrode, wherein the conductive layer comprises a material selected from the group consisting of W, Ti, Ta, Ir, Pt, Ru, Re, Pd, and Os, oxidizing the columnar crystals at the surface of the lower electrode to form a metal oxide between the columnar crystals of the lower electrode to substantially prevent a penetration of oxygen through the lower electrode, forming at least one of a ferroelectric film and a dielectric layer having a perovskite structure on the conductive layer as an insulative layer, and forming an upper electrode on the insulative layer by a sputtering method so as to cover the surface of the insulative layer, wherein the conductive layer substantially prevents degradation of orientation of the insulative layer.

4. A method for manufacturing a ferroelectric capacitor comprising the steps of:

forming a first layer of a material selected from the group consisting of W, Ti, Ta, Ir, Pt, Ru, Re, Pd, and Os on a substrate by a sputtering method, forming a second layer made of columnar crystals comprising a material selected from the group consisting of W, Ti, Ta, Ir, Pt, Ru, Re, Pd, and Os on a surface of the first layer, oxidizing the surface of the second layer to form a metal oxide between the surface columnar crystals of the second layer to substantially prevent a penetration of oxygen through the second layer, forming a conductive layer on the oxidized surface of the second layer, forming at least one of a ferroelectric film and a dielectric layer having a perovskite structure on the conductive layer as an insulative layer, and forming an upper electrode on the insulative layer, wherein the conductive layer substantially prevents degradation of orientation of the insulative layer.

5. A method for manufacturing a ferroelectric capacitor comprising the steps of:

forming a silicon oxidation layer on a silicon substrate by thermal oxidation;

forming a first palladium oxide layer on the silicon oxidation layer by reactive sputtering;

forming a dielectric layer on the palladium oxide layer; and forming a second palladium oxide layer on the dielectric layer by reactive sputtering;

wherein the first palladium oxide layer serves as a lower electrode for the capacitor, and the second palladium oxide layer serves as an upper electrode for the capacitor.

6. The method of claim 5 wherein the dielectric layer is a layer selected from the group consisting of a $SrTiO_3$ layer and a $(Sr, Ba)TiO_3$ layer.

7. A method for manufacturing a ferroelectric capacitor comprising the steps of:

forming a silicon oxidation layer on a silicon substrate by thermal oxidation;

forming a lower electrode on the silicon oxidation layer by reactive sputtering;

forming a ferroelectric film on the lower electrode; and forming an upper electrode on the ferroelectric film by reactive sputtering;

wherein the lower and upper electrodes are formed of a material selected from the group consisting of WOx, TiOx, TaOx, $IrO_2$, $PtO_2$, ReOx, RuOx and OsOx.

8. A method for manufacturing a ferroelectric capacitor comprising the steps of:

forming a silicon oxidation layer on a silicon substrate by thermal oxidation;

forming a first palladium oxide layer on the silicon oxidation layer by reactive sputtering;

forming a ferroelectric film on the palladium oxide layer; and forming a second palladium oxide layer on the ferroelectric film by reactive sputtering;

wherein the first palladium oxide layer serves as a lower electrode for the ferroelectric capacitor, and the second palladium oxide layer serves as an upper electrode for the ferroelectric capacitor.

9. The method of claim 8, further comprising the step of providing a titanium contact layer between the lower electrode and the silicon oxidation layer by sputtering.

10. The method of claim 9 wherein the contact layer has a thickness of approximately 5 nm.

11. The method of claim 8, further comprising the step of providing a platinum contact layer between the lower electrode and the silicon oxidation layer by sputtering.

12. The method of claim 8 wherein the ferroelectric film is a $PbZr_xTi_{1-x}O_3$ (PZT) film.

13. The method of claim 8 wherein the ferroelectric film is a $Bi_4Ti_3O_{12}$ film.

14. The method of claim 8, wherein the first palladium oxide layer is formed from a surface of a first palladium layer, which is made of columnar crystals, by thermal treatment;

wherein the second palladium oxide layer is formed from a surface of a second palladium layer, which is made of columnar crystals, by thermal treatment;

wherein the first palladium layer and the first palladium oxide layer serve as the lower electrode for the ferroelectric capacitor, and the second palladium layer and the second palladium oxide layer serve as the upper electrode.

15. The method of claim 14, further comprising the steps of:

forming a platinum layer on the first palladium layer; and carrying out a thermal treatment resulting in the formation of the first palladium oxide layer from the crystals at the surface of the first palladium layer by forming palladium oxide between the columnar crystals of the first palladium layer located under the platinum layer, to thereby prevent leakage of oxygen through the lower electrode;

wherein the platinum layer is not oxidized.

16. The method of claim 15, further comprising the step of providing a titanium contact layer between the lower electrode and the silicon oxidation layer.

17. The method of claim 15, further comprising the step of providing a platinum contact layer between the lower electrode and the silicon oxidation layer.

18. The method of claim 15 wherein the ferroelectric film is a $PbZr_xTi_{1-x}O_3$ (PZT) film.

19. The method of claim 15 wherein the ferroelectric film is a $Bi_4Ti_3O_{12}$ film.

20. The method of claim 15 wherein the platinum layer has a thickness of approximately 30 nm.

21. The method of claim 14, further comprising the steps of:

forming an iridium layer on the first palladium layer; and carrying out a thermal treatment resulting in the formation of the first palladium oxide layer from some of the crystals at the surface of the first palladium layer by forming a palladium oxide between the columnar crystals of the first palladium layer located under the iridium layer, thereby preventing leakage of oxygen though the lower electrode;

wherein the iridum layer is not oxidized.

22. The method of claim 14, further comprising the steps of:

forming a conductive layer on the first palladium layer; and carrying out a thermal treatment resulting in the formation of the first palladium oxide layer from the crystals at the surface of the first palladium layer by forming a palladium oxide between the columnar crystals of the first palladium layer located under the conductive layer, thereby preventing leakage of oxygen though the lower electrode;

wherein the conductive layer is not oxidized and is comprised of a material selected from the group consisting of W, Ti, Ta, Ir, Pt, Ru, Re and Os.

23. The method of claim 8 wherein the silicon oxidation layer has a thickness of approximately 600 nm.

24. The method of claim 8 wherein the lower electrode has a thickness of approximately 200 nm.

25. The method of claim 8 wherein the ferroelectric film has a thickness of approximately 250 nm.

26. The method of claim 8 wherein the upper electrode has a thickness of approximately 200 nm.

* * * * *